(12) United States Patent
Watanabe

(10) Patent No.: US 6,906,902 B2
(45) Date of Patent: Jun. 14, 2005

(54) SEMICONDUCTOR INTEGRATED CIRCUIT

(75) Inventor: Kiyomi Watanabe, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 237 days.

(21) Appl. No.: 10/263,700

(22) Filed: Oct. 4, 2002

(65) Prior Publication Data

US 2003/0067340 A1 Apr. 10, 2003

(30) Foreign Application Priority Data

Oct. 5, 2001 (JP) ........................................ 2001-309829

(51) Int. Cl.$^7$ ............................................. H02H 5/04
(52) U.S. Cl. ...................................... 361/103; 323/907
(58) Field of Search ................................ 323/313, 907; 327/539, 513; 361/93.1, 93.7, 93.8, 93.9, 103, 106

(56) References Cited

U.S. PATENT DOCUMENTS

| | | | | |
|---|---|---|---|---|
| 4,355,344 A | * | 10/1982 | Felici et al. ................. | 361/103 |
| 4,669,026 A | * | 5/1987 | Widlar ......................... | 361/103 |
| 4,937,697 A | * | 6/1990 | Edwards et al. .............. | 361/18 |
| 5,008,771 A | * | 4/1991 | Palara .......................... | 361/103 |
| 5,390,069 A | * | 2/1995 | Marshall ....................... | 361/103 |
| 5,428,287 A | | 6/1995 | Agiman ........................ | 323/284 |
| 5,838,187 A | * | 11/1998 | Embree ........................ | 327/512 |

* cited by examiner

*Primary Examiner*—Ronald Leja
(74) *Attorney, Agent, or Firm*—Oblon, Spivak, McClelland, Maier & Neustadt, P.C.

(57) ABSTRACT

A semiconductor integrated circuit comprises a transistor which has a first electrode, a second electrode and a third electrode, said transistor conducting a current of a first power source from the second electrode to the third electrode by a power supplied to the first electrode; a driver to supply said first electrode with power for driving said transistor; a reference voltage circuit to generate a reference voltage which is variable in response to temperature of said transistor, said reference voltage being used as the reference for comparison; a comparative voltage circuit to generate a comparative voltage which is variable in response to a current flowing from said second electrode to said third electrode, said comparative voltage being compared with said reference voltage; and a controller which receives said reference voltage and said comparative voltage and which supplies a control signal to said driver, said control signal being based on a result of the comparison between the comparative voltage and the reference voltage to control the power supplied to said first electrode.

16 Claims, 5 Drawing Sheets

500

SEMICONDUCTOR INTEGRATED CIRCUIT

CROSS-REFERENCE TO RELATED APPLICATIONS

This application is based upon and claims the benefit of priority from the prior Japanese Patent Application No. 2001-309829, filed on Oct. 5, 2001, the entire contents of which are incorporated herein by reference.

BACKGROUND OF THE INVENTION

1. Field of the Invention

This invention relates to a semiconductor integrated circuit.

2. Related Background Art

In general, Semiconductor integrated circuits having a power transistor suffer from heat generated by electric current flowing through the power transistor. The heat may raise the temperature of the junction of the power transistor, and thereby may break the power transistor and elements placed around it.

As a countermeasure, an overheat detector circuit has been provided heretofore to detect the temperature of the junction of the power transistor.

FIG. 8 is a schematic diagram of a conventional semiconductor integrated circuit 800 having an overheat detector circuit. The semiconductor integrated circuit 800 includes a bipolar transistor 10, driver 20 for driving the transistor 10, reference voltage circuit 30 for generating a reference voltage, resistor R1 connected between a power source and an emitter, an over-current detector circuit 50 which detects the emitter current by comparing a comparative voltage from the power source via the resistor R1 with the reference voltage and thereby controls the driver 20, and an overheat detector circuit 65 for controlling the driver 20 in accordance with the temperature of the junction of the transistor 10.

Operation of the semiconductor integrated circuit 800 is explained below with reference to FIGS. 8 and 9. FIG. 9 shows a graph of changes in the quantity of emitter current IE with temperature Tj at the junction of the transistor 10.

Since the comparative voltage is applied from the power source VCC through the resistor R1, it varies with the emitter current IE. The reference voltage is a constant voltage determined by the electromotive force of the reference voltage circuit 30.

The over-current detector circuit 50 compares the comparative voltage with the reference voltage, and controls the driver 20 to prevent the emitter current IE from increasing beyond a predetermined value Ioc (see FIG. 9).

If the emitter current Ioc continuously flows in the transistor 10, the junction temperature Tj of the transistor 10 rises because the energy VCE*Ioc continuously generates at the junction of the transistor 10, where VCE is the collector-emitter voltage. Continuous rise of the junction temperature Tj will break the transistor 10. Therefore, the overheat protective circuit 65 controls the driver 20 to prevent the junction temperature Tj from surpassing a predetermined value Tot.

That is, in FIG. 9, when the junction temperature Tj reaches Tot, the driver 20 shuts the transistor 10 off so as not to move it into the state of the shadowed region Sb. As a result, the transistor 10 turns OFF and the emitter current IE stops.

In this manner, the overheat protective circuit 65 was heretofore used to protect the transistor 10 and its peripheral elements from destruction by overheating.

However, in case the rising rate (for example, K/s (Kelvin per second)) of the junction temperature Tj per unit time is too high for the overheat detector circuit 65 to catch up to for detection, or in case the junction temperature Tj is already high when the transistor 10 is activated, the transistor 10 may undesirably move into the state of the shadowed region Sb.

For example, assume here that the junction temperature Tj is high when the transistor 10 is activated and that the transistor 10 is in the state of the region Sa of FIG. 9. Even in this case, the over-current detector circuit 50 permits the emitter current Ioc to flow into the transistor 10. Therefore, the transistor 1 heretofore taking the state of the region Sa shifts to the state of the region Sb before the overheat detector circuit 65 can detect it and turns OFF the transistor 10.

Therefore, the semiconductor integrated circuit 800 even with the overheat detector circuit 65 was still unable to reliably protect internal elements from heat of the power transistor.

It is therefore desirable to provide a semiconductor integrated circuit which is capable of reliably protecting the power transistor and its peripheral elements against heat of the power transistor.

BRIEF SUMMARY OF THE INVENTION

A semiconductor integrated circuit according to an embodiment of the invention comprises: a transistor which has a first electrode, a second electrode and a third electrode, said transistor conducting a current of a first power source from the second electrode to the third electrode by a power supplied to the first electrode; a driver to supply said first electrode with power for driving said transistor; a reference voltage circuit to generate a reference voltage which is variable in response to temperature of said transistor, said reference voltage being used as the reference for comparison; a comparative voltage circuit to generate a comparative voltage which is variable in response to a current flowing from said second electrode to said third electrode, said comparative voltage being compared with said reference voltage; and a controller which receives said reference voltage and said comparative voltage and which supplies a control signal to said driver, said control signal being based on a result of the comparison between the comparative voltage and the reference voltage to control the power supplied to said first electrode.

A semiconductor integrated circuit according to a further embodiment of the invention comprises: a transistor which has a first electrode, a second electrode and a third electrode, said transistor conducting a current of a first power source from the second electrode to the third electrode by a power supplied to the first electrode; a driver to supply said first electrode with power for driving said transistor; a reference voltage circuit to generate a reference voltage which is used as the reference for comparison; a comparative voltage circuit to generate a comparative voltage which is variable in response to both the temperature of said transistor and a value of the current flowing from said second electrode to said third electrode, said comparative voltage being compared with said reference voltage; and a controller which receives said reference voltage and said comparative voltage and which supplies a control signal to said driver, said control signal being based on a result of comparison between the comparative voltage and the reference voltage to control the power supplied to said first electrode.

DETAILED DESCRIPTION OF THE INVENTION

Some embodiments of the invention will now be explained below with reference to the drawings. These embodiments, however, should not be construed to limit the invention.

Figure 1:
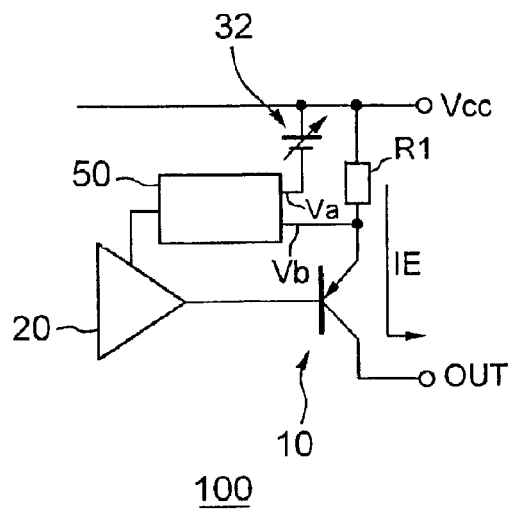
FIG. 1 is a circuit diagram of a semiconductor integrated circuit 100 according to an embodiment of the invention.

FIG. 1 is a circuit diagram of a semiconductor integrated circuit 100 according to an embodiment of the invention. The semiconductor integrated circuit 100 includes a bipolar transistor 10 and a driver circuit 20. The bipolar transistor 10 permits a current from a power source VCC to flow from the emitter to the collector as the emitter current IE depending on a current supplied to the base. The driver circuit 20 drives the transistor 10.

The semiconductor integrated circuit further includes a reference voltage source 32 and a resistor R1. The reference voltage source 32 generates a reference voltage Va variable with temperature Tj of a junction formed inside the transistor 10. The resistor R1 generates a comparative voltage vb compared with the reference voltage Va and variable with the emitter current (flowing in the arrow-marked direction).

The semiconductor integrated circuit 100 further includes an over-current detector circuit 50. The over-current detector circuit 50 outputs a control signal to the driver circuit 20 to interrupt the current to the base when the comparative voltage Vb input from the resistor R1 is equal to or lower than the reference voltage Va input from the reference voltage source 32.

Figure 2:
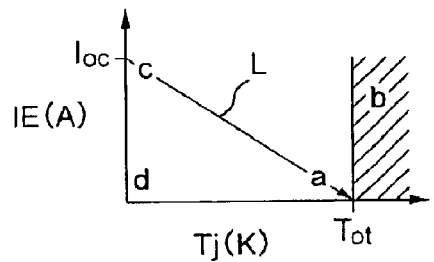
FIG. 2 is a diagram of a graph showing changes in the quantity of emitter current IE with temperature Tj at the junction of a transistor 10.

In conjunction with FIGS. 1 and 2, operation of the semiconductor integrated circuit 100 is explained below. FIG. 2 is a diagram of a graph showing changes in the quantity of emitter current IE with temperature Tj at the junction of a transistor 10.

Assume here that the junction temperature Tj of the transistor 10 is relatively low and the emitter current IE is relatively small. That is, the transistor 10 is assumed to currently take the state of the region Sd in FIG. 2.

The reference voltage Va is a voltage obtained by voltage drop from the voltage of the power source VCC by the reference voltage source 32. The reference voltage source 32 sets the reference voltage Va relatively low when the junction temperature Tj is relatively low.

Since the comparative voltage Vb is applied from the power source VCC through the resistor R1, it varies with the emitter current IE. When the emitter current IE is relatively small, voltage drop by the resistor R1 is relatively small, and accordingly, the comparative voltage Vb is relatively high.

Therefore, when the emitter current IE is relatively small, the comparative voltage Vb is higher than the reference voltage Va, and the potential difference between the comparative voltage Vb and the reference voltage Va is relatively large. As a result, the transistor 10 can afford to conduct larger emitter current IE.

Next assume that the emitter current IE has become relatively large, and the reference voltage Va and the comparative voltage Vb have been approximately equalized. That is, the transistor 10 is assumed to currently take the state of the region Sc in FIG. 2.

Since the junction temperature Tj is still relatively low, the reference voltage Va remains relatively low as well. However, since voltage drop by the resistor R1 increases as the emitter current IE increases, the comparative voltage Vb drops. When the comparative voltage Vb goes down to become approximately equal to the reference voltage Va, the over-current detector circuit 50 gives a control signal to the driver circuit 20 to interrupt the voltage to the base. As a result, the transistor 10 is switched OFF.

That is, in FIG. 2, when the emitter current IE becomes substantially equal to a predetermined current value (herein below called current restrictive value Ioc), the transistor 10 is switched OFF, and the emitter current IE can no longer flow between the emitter and the collector of the transistor 10. Therefore, the emitter current IE never surpasses the current restrictive value Ioc.

On the other hand, when the emitter current IE decreases below the current restrictive value Ioc, the transistor 10 is switched ON, and the emitter current IE is permitted to flow between the emitter and the collector of the transistor 10. Therefore, the emitter current IE is controlled to be equal to the current restrictive value Ioc.

Next assume that the junction temperature Tj of the transistor 10 is relatively high. That is, let the transistor 10 currently take the state of the region Sa.

The reference voltage source 32 is configured to set the reference voltage Va higher as the junction temperature Tj rises. When the reference voltage Va becomes high, voltage breadth permitting the comparative voltage Vb to lower is narrowed greatly. That is, larger emitter current IE can no longer flow. Therefore, in response to the rise of the junction temperature Tj, the current restrictive value Ioc decreases. In the embodiment shown here, the junction temperature Tj and the current restrictive value Ioc are approximately inversely proportional.

For example, when the thermal resistance is Rth (° C./W) and the emitter-collector voltage is VCE, the current restrictive value Ioc is expressed as $$Ioc = (Tot - Tj)/(Rth * VCE) \qquad (1)$$

It can be understood from Equation (1) that the junction temperature Tj is inversely proportional to the current restrictive value Ioc.

Figure 9:
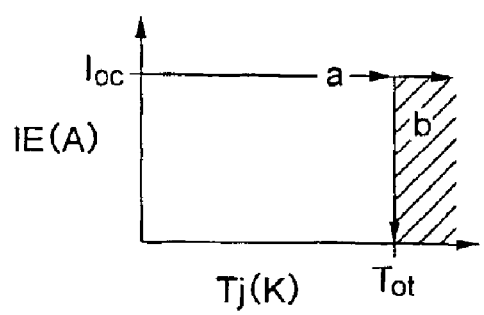
FIG. 9 is a diagram of a graph showing changes in the quantity of emitter current IE with temperature Tj at the junction of a transistor 10.

In conventional techniques, the current restrictive value Ioc was constant independently from the junction temperature Tj as shown in FIG. 9.

In FIG. 2, however, the current restrictive value Ioc varies with the junction temperature Tj. In the instant embodiment, when the junction temperature Tj is near to the predetermined value Tot, the current restrictive value Ioc is nearly zero. Therefore, the emitter current IE can reach the current restrictive value Ioc in a short time.

Accordingly, even if the rising rate of the junction temperature Tj per unit time is high or even if the junction temperature Tj is already high when activation of the transistor 10 is started, the transistor 10 never becomes the state of the shadowed region Sb, and it does not break. Therefore, the configuration of the semiconductor integrated circuit 100 reliably protects the transistor 10 from excessive emitter current IE.

The semiconductor integrated circuit 100 need not include the overheat detector circuit 65 required in the conventional semiconductor integrated circuit 800. Thus the semiconductor integrated circuit 100 can be smaller than the conventional semiconductor integrated circuit 800.

The transistor 10 used in the semiconductor integrated circuit 100 is a PNP bipolar transistor, but an NPN bipolar transistor may be used instead.

Figure 3:
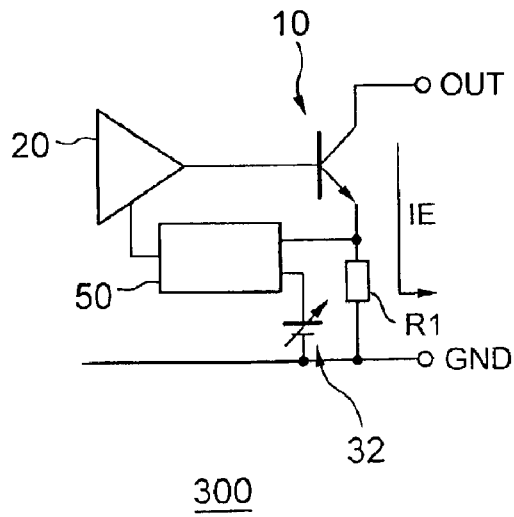
FIG. 3 is a circuit diagram of a semiconductor integrated circuit 300 using an NPN bipolar transistor as the transistor 10.

FIG. 3 is a circuit diagram of a semiconductor integrated circuit 300 using an NPN bipolar transistor as the transistor 10.

In the semiconductor integrated circuit 300 shown in FIG. 3, respective components may be arranged similarly to those of the semiconductor integrated circuit 100 while using the ground as a power source. The change of the conduction type is similarly possible also for other embodiments explained later.

In addition to typical bipolar transistors, MOS transistors, IGBT (insulated gate bipolar transistor) are also usable as the transistor 10. In case a MOS transistor is used as the transistor 10, the emitter and the collector may be replaced by combination of gate, source and drain or combination of gate drain and source, in this and other embodiments.

Figure 4:
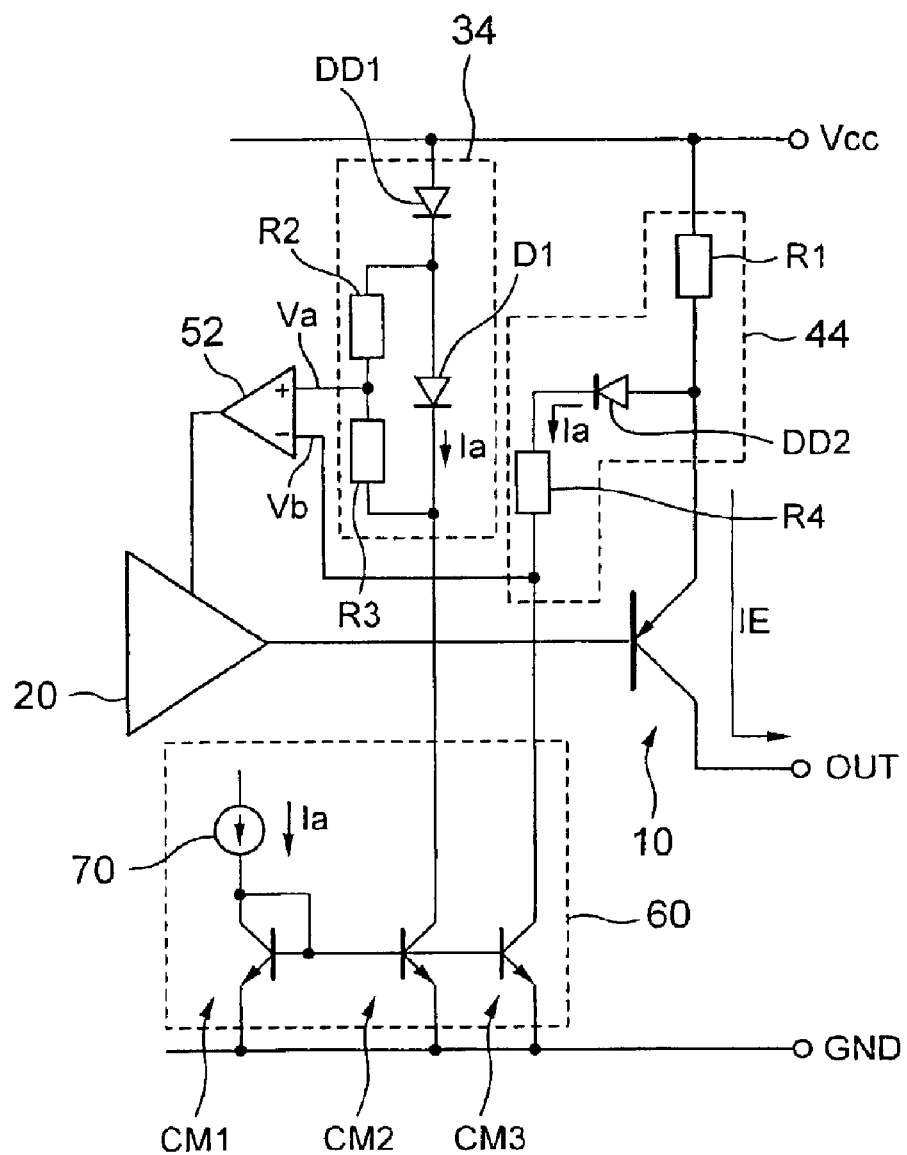
FIG. 4 is a circuit diagram of a semiconductor integrated circuit 400 as an embodiment of the semiconductor integrated circuit 100.

FIG. 4 is a circuit diagram of a semiconductor integrated circuit 400 as a more detailed embodiment of the semiconductor integrated circuit 100. The semiconductor integrated circuit 400 includes a constant current circuit 60 and a reference voltage generator 34. The reference voltage generator 34 includes a diode D1 connected in series in the way from the power source VCC to the constant current circuit 60, resistors R2 and R3 connected in series to each other and connected in parallel to the diode D1, and diode DD1 connected in series in the way from the power source VCC and the diode D1. The constant current circuit 60 is connected to the ground.

The diode D1 is placed on a common chip with the transistor 10. Temperature of the diode D1 is proportional to the temperature of the transistor 10. More preferably, the temperature of the diode D1 is equal to the temperature of the transistor 10. Therefore, the diode D1 is preferably located near the transistor 10.

Operation of the semiconductor integrated circuit 400 is explained in conjunction with its configuration.

In general, operation voltage of a diode has a constant temperature property about $-2$ mV/° C. Accordingly, the diode D1 generates a potential difference approximately proportional to the temperature of the transistor 10.

Potential difference across opposite ends of the diode D1 is divided by the resistors R2, R3 connected in parallel to the diode D1. For example, if the resistance ratio of the resistors R2 and R3 is 1:1, the potential difference across opposite ends of the diode D1 is divided to one-half. In this case, the reference voltage Va corresponds to a value obtained by subtracting the operation voltage of the diode DD1 and one-half of the operation voltage of the diode D1 from the voltage of the power source VCC. That is, when the operation voltage of the diode is VF, it becomes $$Va = VCC - VD - (½)*VF$$

When the resistance ratio of the resistors R2 ad R3 is adjusted to be 1:1, it remains unchanged regardless of the temperature properties of the resistors R2 and R3.

If the resistance values of the resistors R2 and R3 are R2 and R3, respectively, Va can be expressed as $$Va = VCC - VD - (R2/(R2+R3))*VF \qquad (2)$$

As such, since the operation voltage VF has a temperature property, it is appreciated that the reference voltage Va also has a temperature property.

The semiconductor integrated circuit 400 includes a comparative voltage generator 44 having a resistor R1, a diode DD2 and a resistor R4. An end of the resistor R4 is connected to a junction between the emitter and the resistor R1, and the other end of the resistor R4 is connected to the constant current circuit 60 via the diode DD2.

Electric current from the power source VCC flows into the transistor 10 through the resistor R1. After electric current flows through the resistor R1, it flows through the diode DD2 and the resistor R4. Therefore, the comparative voltage Vb becomes a value obtained by subtracting a voltage drop by the resistor R1, operation voltage of the diode DD2 and a voltage drop by the resistor R4 from the voltage of the power source VCC. When the current flowing into the resistor R4 is Ia, the comparative voltage vb can be expressed by $$Vb = VCC - (IE+Ia)*R1 - VF - Ia*R4 \approx VCC - IE*R1 - VF - Ia*R4 \qquad (3)$$

where IE>>Ia.

A comparator 52 compares the comparative voltage Vb with the reference voltage Vb, and outputs its result to the driver 20.

The constant current circuit 60 has a current mirror circuit including transistors CM1, CM2 and CM3 having emitters grounded and having a common base. The collector of the transistor CM1 is connected to the base and further to a constant current source 70. The collector of the transistor CM2 is connected to the diode D1, and the collector of the transistor CM3 to the resistor R4.

Collector potential of the transistor CM1 and base potential of the transistors CM1, CM2 and CM3 are equal. Therefore, if the transistors CM1, CM2, CM3 are equal in size, a current equal to the current Ia from the constant current source 70 flows between collectors and emitters of the transistors CM1, CM2, and CM3. Accordingly, the equal constant current Ia flows in both the diode D1 and the resistor R4. Therefore, resistance value of the resistor R4 can be easily set, and the diodes DD1 and DD2 can be well balanced as well.

When the emitter current IE is small, potential of the comparative voltage Vb is higher than the potential of the reference voltage Va. As the emitter current IE decreases, the comparative voltage Vb lowers and approaches the reference voltage Va. When the comparative voltage Vb becomes equal to the reference voltage Va, the difference between the comparative voltage Vb and the reference voltage Va compared by the comparator 52 becomes smaller than a predetermined value. As a result, the driver circuit 20 interrupts the current to the base of the transistor 10. Therefore, the transistor 10 turns OFF and the emitter current IE does not flow.

When the comparative voltage Vb becomes equal to the reference voltage Va, that is, when Vb=Va, the following equation is established from Equations 2 and 3.

$$VCC-VF-(R2/(R2+R3))*VF=VCC-Ioc*R1-VF-Ia*R4 \quad (4)$$

Note here that IE is replaced by Ioc in Equation 4 because the emitter current IE equals the current restrictive value Ioc under Vb=Va.

When Equation (4) is rearranged and differentiated by temperature, the following equation is established.

$$dIoc/dT=1/R1*(R2/(R2+R3))*dVF/dT \quad (5)$$

where dIa/dT=0, and dR1/dT=0.

In general, $dVF/dT \approx -2$ mV/° C. Therefore, according to Equation (5), Ioc is inversely proportional to the temperature. That is, Ioc has a negative temperature property. As a result, the semiconductor integrated circuit 400 according to the instant embodiment exhibits the property as shown by the graph of FIG. 2. That is, Ioc varies with the junction temperature Tj of the transistor 10.

Figure 5:
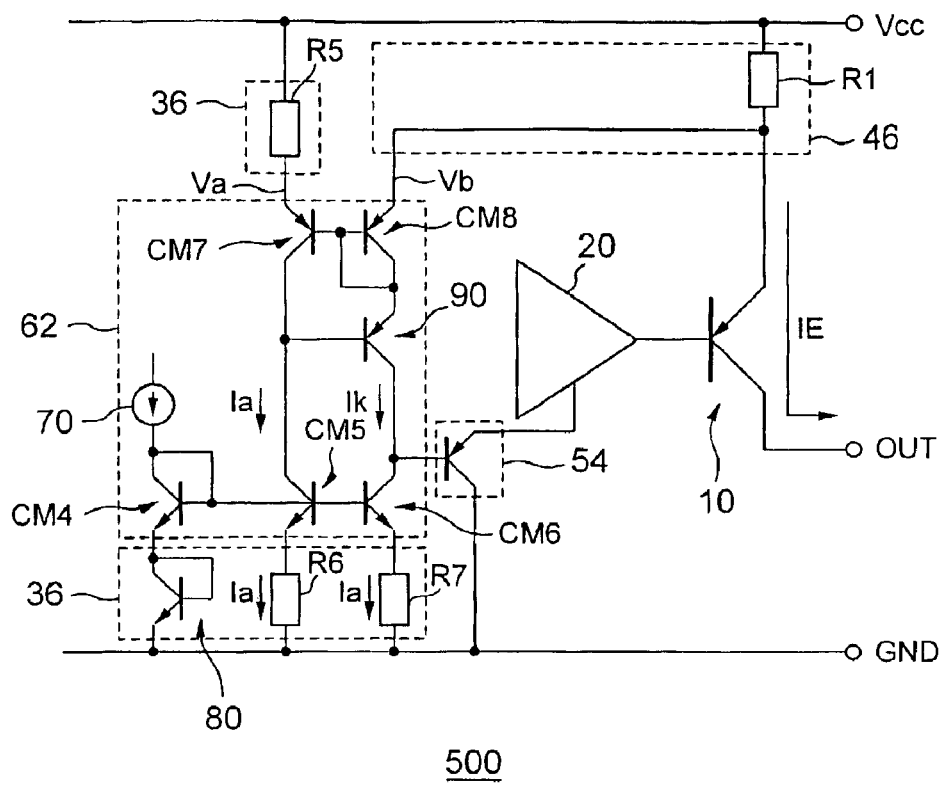
FIG. 5 is a circuit diagram of a semiconductor integrated circuit 500 as another embodiment of the semiconductor integrated circuit 100.

FIG. 5 is a circuit diagram of a semiconductor integrated circuit 500 as another detailed embodiment of the semiconductor integrated circuit 100.

The semiconductor integrated circuit 500 includes a reference voltage generator 36 having a resistor R5, resistors R6 and R7 and bipolar transistor 80. One end of the resistor R5 is connected to the power source VCC. One end of the resistors R6 and R7 is connected, respectively, to the other end of the resistor R5. The other end of the resistors R6 and R7 is grounded. The bipolar transistor 80 is connected between a constant current circuit 62 and a ground connection. The base and the collector of the transistor 80 are connected to each other, and the transistor 80 functions as a diode. The transistor 80 has a temperature proportional or equal to the junction temperature of the transistor 10. Thus the transistor 80 functions as a heat-sensitive element. The transistor 80 is preferably located near the transistor 10 to accurately detect the junction temperature of the transistor 10. In the semiconductor integrated circuit 500, the reference voltage Va is the result of the current passing through the resistor R5.

The comparative voltage circuit has a interconnection connected from a node between the resistor R1 and the transistor 10 to the constant current circuit 62. In the semiconductor integrated circuit 500, the comparative voltage Vb is the voltage of the current passing through the resistor R1.

The constant current circuit 62 supplies a constant current to the reference voltage generator 36 and a comparative voltage generator 46 in order to have the reference voltage generator 36 and the comparative voltage generator 46 generate the reference voltage and the comparative voltage, respectively. The constant voltage circuit 62 receives the reference voltage and the comparative voltage, and supplies a current based on the comparative voltage to a bipolar transistor 54. The bipolar transistor 54 switches the drive signal in response to the current from the constant current circuit 62.

Operation of the semiconductor integrated circuit 500 is explained below in conjunction with its configuration.

The constant current circuit 62 includes a first current mirror circuit having transistors CM4, CM5 and CM6 having a common base. The collector of the transistor CM4 is connected to the base of its own and further to a constant current source 70, and its emitter is connected to the collector of the transistor 80. Emitters of the transistors CM5 and CM6 are connected to resistors R6 and R7, respectively.

Since the transistors CM4, CM5 and CM6 have a common base potential, potential difference across the collector and the emitter of the transistor 80, the potential difference between both ends of the resistor R6 and the potential difference between both ends of the resistor R7 are equal. Additionally, in case the resistance value of the resistor R6 and that of the resistor R7 are equalized, an equal reference current Ia flows in the transistor CM6 and CM7. Further, since the transistor 80 has a potential difference relying upon the junction temperature of the transistor 10, the reference current Ia also relies on the junction current Tj of the transistor 10.

On the other hand, the constant current circuit 62 includes a second current mirror circuit having transistors CM7 and CM8 using a common base. The collector of the transistor CM7 is connected to the collector of the transistor CM5. The collector of the transistor CM8 is connected to the base of its own and to the transistor CM6 via a bipolar transistor 90. The emitter of the transistor CM7 is connected to the resistor R5, and the emitter of the transistor CM8 is connected to a node between the resistor R1 and the transistor 10.

Therefore, in the second current mirror circuit, the transistor CM7 receives the reference voltage Va from the reference voltage generator 36, and the transistor CM8 receives the comparative voltage Vb from the comparative voltage generator 46. Additionally, since the transistors CM7 and CM8 are equal in potential of the base, they supply the reference current Ia and the comparative current Ik corresponding to the reference voltage Va and the comparative voltage Vb, respectively.

The circuit is designed such that a current equal to the current Ia controlled by the first current mirror circuit flows as the reference current. On the other hand, the comparative current does not always coincide with the current Ia, but it corresponds to the comparative voltage Vb. Therefore, if the comparative voltage Vb is higher than the reference voltage Va, a larger comparative current Ik than the reference current Ia will flow. That is, in this case, the reference current Ik flowing from the transistor 90 to the base of the transistor 54 is larger than the reference current Ia flowing in the resistor R7.

By the difference between the reference current Ia and the comparative current Ik, the transistor 54 is controlled to be ON or OFF.

In case the comparative current Ik is larger than the reference current Ia, no base current is generated in the transistor 54. Therefore, the driver circuit 20 maintains the base of the transistor 10 ON, and the emitter current IE continues to flow.

In case the comparative current Ik is smaller than the reference current Ia, the base current is generated in the transistor 54. Therefore, the transistor 54 is switched ON. As a result, the driver circuit 20 switches the transistor 10 OFF, and the emitter current IE does not flow.

In this manner, the transistor 54 is switched when the comparative current Ik becomes equal to the reference current Ia, that is, when the comparative voltage Vb becomes equal to the reference voltage Va. Further, the reference current Ia is changed by the transistor 80. And the reference current Ia depends upon the junction temperature Tj of the transistor 10. Therefore, the semiconductor integrated circuit 500 exhibits the same property as that of the graph of FIG. 2.

Using equations, it is explained that the semiconductor integrated circuit 500 exhibits the property as shown by the graph of FIG. 2.

Since the reference voltage Va is the voltage of the power source VCC after passing the resistor R5, it can be expressed by $$Va = VCC - Ia*R5 \quad (6)$$

The reference current Ia is determined by the potential difference across both ends of the resistor R6, i.e. the potential difference between the base and the emitter of the transistor 80, and the resistance value of the resistor R6. That is, $$Ia = VF/R6 \quad (7)$$

From Equations 6 and 7, $$Va = VCC - (R5/R6)*VF \quad (8)$$

Since the comparative voltage Vb is the voltage of the power source VCC after passing the resistor R1, it can be expressed by $$Vb = VCC - (IE + Ik)*R1 \quad (9)$$

If the emitter current IE is an over-current, Ik is as small as negligible relative to IE. Therefore, Equation (9) can be expressed by $$Vb = VCC - IE*R1 \quad (10)$$

When the comparative voltage Vb equals the reference voltage Va, the transistor 54 detects an over-current. Therefore, the following equation is established from Equations (8) and (10).

$$VCC - (R5/R6)*VF = VCC - Ioc*R1 \quad (11)$$

Note that IE is replaced by Ioc in Equation (11) because the emitter current IE is the current restrictive value Ioc when Vb=Va.

When Equation (11) is rearranged and differentiated by temperature, the following equation is established.

$$dIoc/dT = 1/R1*(R5+R6)*dVF/dT \quad (12)$$

where dR1/dT=0.

In general, dVF/dT=−2 mV/° C. Therefore, according to Equation (12) similarly to Equation (5), Ioc is inversely proportional to the temperature. That is, Ioc has a negative temperature property. As a result, the semiconductor integrated circuit 500 according to the instant embodiment exhibits the property as shown by the graph of FIG. 2. That is, Ioc varies with the junction temperature Tj of the transistor 10.

The transistor 90 is used to correct the base current and thereby keep the reference current Ia and the comparative current Ik in precise correspondence to the reference voltage Va and the comparative voltage Vb. The second current mirror circuit including this transistor 90 forms a so-called Wilson constant current circuit.

Figure 6:
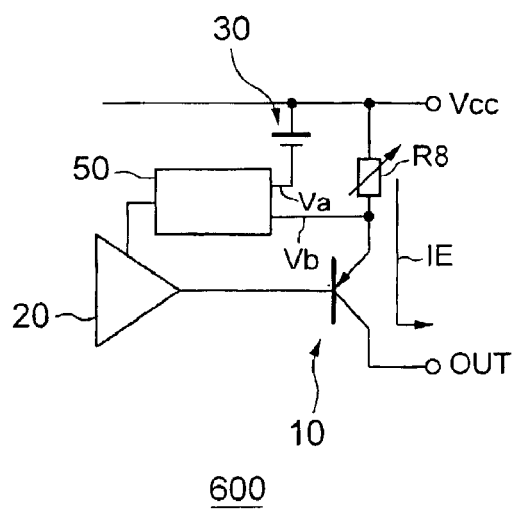
FIG. 6 is a circuit diagram of a semiconductor integrated circuit 600 according to a further embodiment of the invention.

FIG. 6 is a circuit diagram of a semiconductor integrated circuit 600 according to a further embodiment of the invention. Similarly to the semiconductor integrated circuit 100, the semiconductor integrated circuit 600 includes the bipolar transistor 10, driver circuit 20 and over-current detector circuit 50.

The semiconductor integrated circuit 600 additionally includes a reference voltage circuit 30 connected between the power source VCC and the over-current detector circuit 50, and a resistor R8 connected in series between the power source VCC and the collector of the transistor 10.

The difference between the semiconductor integrated circuit 600 and the semiconductor integrated circuit 100 is in that the reference voltage circuit 30 has no temperature property but the resistor R8 has a temperature property. That is, the reference voltage circuit 30 supplies a constant reference voltage Va to the over-current detector circuit 50 independently from the junction temperature of the transistor 10. In contrast, the resistor R8 supplies the comparative voltage Vb to the over-current detector circuit 50. The comparative voltage Vb is variable with the junction temperature of the transistor 10.

The resistor R8 changes the comparative voltage Vb in response to the emitter current IE. Therefore, the comparative voltage Vb varies depending upon both the junction temperature Tj of the transistor 10 and the emitter current IE.

In the instant embodiment, the resistor R8 should be formed on the common chip together with the transistor 10 and located near the junction of the transistor 10.

Figure 7:
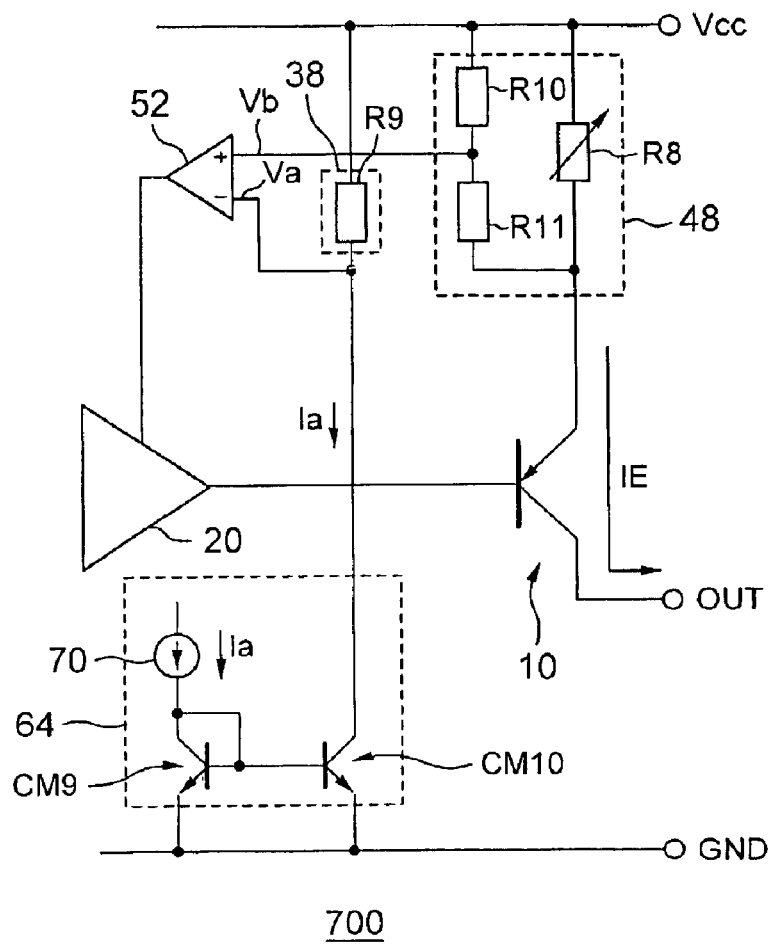
FIG. 7 is a circuit diagram of a semiconductor integrated circuit 700 as an embodiment of the semiconductor integrated circuit 600.
Figure 8:
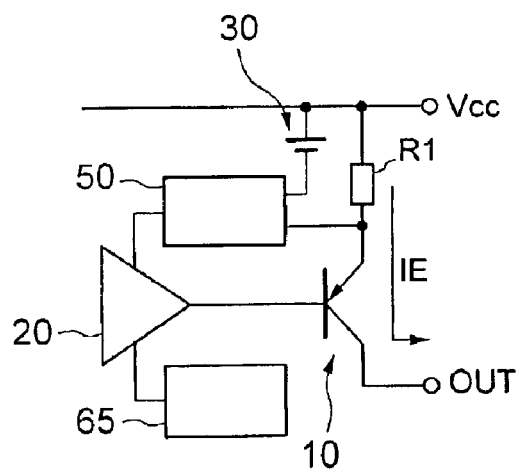
FIG. 8 is a block diagram of a conventional semiconductor integrated circuit 800 having an overheat detector circuit.

FIG. 7 is a circuit diagram of a semiconductor integrated circuit 700 as a more detailed embodiment of the semiconductor integrated circuit 600. The semiconductor integrated circuit 700 includes a reference voltage generator 38 having a resistor R9 connected in series between the power source VCC and the constant current source 64. Therefore, the reference voltage Va is a result of a current from the power source VCC flowing through the resistor R9.

The semiconductor integrated circuit 700 additionally includes a comparative voltage generator 48 having a resistor R8 that produces a potential difference depending upon the junction temperature of the transistor 10 and functions as a heat-sensitive element. The comparative voltage generator 48 further includes resistors R10 and R11 connected in series to each other and connected in parallel to the resistor R8.

The reference voltage Vb is the voltage at the junction of the resistors R10 and R11, and corresponds to a voltage obtained by dividing the potential difference across both ends of the resistor R8.

The semiconductor integrated circuit 700 includes a current mirror circuit 64 having transistors CM9 and CM10 that have emitters grounded and a common base. The collector of the transistor CM9 is connected to the base of its own and further to a constant current source 70. The collector of the transistor CM10 is connected to the resistor R9.

Collector potential of the transistor CM9 and base potential of the transistors CM9, CM10 are equal. Therefore, the transistors CM9 and CM10 are equally sized such that a current equal to the current Ia from the constant current source 70 flows between the collector and the emitter of the transistor CM10. Thus, the constant current Ia flows in the resistor R9, and the reference voltage Va is kept constant.

Using equations, operation of the semiconductor integrated circuit 700 is explained below.

Since the reference voltage Va is the voltage of the power source VCC after passing the resistor R9, it is expressed by $$Va = VCC - Ia*R9 \quad (13)$$

The comparative voltage Vb is a voltage obtained by dividing the potential difference between both ends of the resistor R8 divided by resistors R10 and R11. Therefore, it is expressed by $$Vb = VCC - [R10/(R10+R11)]*(IE*R8) \quad (14)$$

When the comparative voltage Vb equals the reference voltage Va, the comparator 52 makes the driver circuit 20 interrupt the transistor 10. Therefore, from Equations (13) and (14), the following equation is established.

$$VCC-Ia*R9=VCC-[R10/(R10+R11)]*(Ioc*R8) \qquad (15)$$

IE is replaced by Ioc because the emitter current IE is the current restrictive value Ioc when Vb=Va. When it is rearranged and differentiated by temperature, the following equation is established.

$$dIoc/dT=[R9*(R10+R11)/R10]*Ia*d(1/R8)/dT \qquad (16)$$

In this case, dR9/dT=0.

A potential difference across both ends of the resistor R8 increases with temperature. That is, the resistor R8 has a positive temperature property. Therefore, d(1/R8)/dT in Equation 16 is negative. Thus the current restrictive value Ioc is inversely proportional to the temperature. That is, the current restrictive value Ioc has a negative temperature property. Therefore, the semiconductor integrated circuit 700 according to the instant embodiment can also exhibit the same property as shown by the graph of FIG. 2.

Note here that reference numerals of respective components are used as their voltage values, current values and resistance values in the equations.

The resistors in the foregoing embodiments may be load elements having resistance components. For example, transistors may be used as loads. Additionally, diodes in the foregoing embodiments may be any elements having PN junctions. For example, bipolar transistors, which have the base of its own connected to the collector of its own, are usable.

Furthermore, transistors in the foregoing embodiments may be MOS transistors as well.

As such, the semiconductor integrated circuits explained as the foregoing embodiments can reliably protect power transistors and their peripheral elements from heat of the transistors.

Moreover, any of the semiconductor integrated circuits according to the above-explained embodiments need not over-heat protective circuit, and can be smaller than conventional ones.

What is claimed is:

1. A semiconductor integrated circuit comprising:
   a transistor which has a first electrode, a second electrode and a third electrode, said transistor conducting a current of a first power source from said second electrode to said third electrode by a power supplied to said first electrode;
   a driver configured to supply said first electrode with power for driving said transistor;
   a reference voltage circuit configured to generate a reference voltage which is variable in response to temperature of said transistor, said reference voltage being used as the reference for comparison, said reference voltage circuit including a heat-sensitive element which is disposed on a common chip together with said transistor to generate a potential difference depending upon temperature of said transistor;
   a comparative voltage circuit configured to generate a comparative voltage which is variable in response to a current flowing from said second electrode to said third electrode, said comparative voltage being compared with said reference voltage;
   a controller which receives said reference voltage and said comparative voltage and which supplies a control signal to said driver, said control signal being based on a result of the comparison between the comparative voltage and the reference voltage to control the power supplied to said first electrode; and
   a constant current circuit which flows a constant current to said heat-sensitive element;
   wherein said heat-sensitive element intervenes in series in the line from said first power source to said constant current circuit,
   wherein said reference voltage circuit includes first and second loads which are connected in series to each other and connected in parallel to said heat-sensitive element,
   wherein said reference voltage is obtained by dividing the potential difference across opposite ends of said heat-sensitive element at a node between said first and second loads, and
   wherein said controller includes a comparator which compares said reference voltage and said comparative voltage to output a result of the comparison to said driver.

2. The semiconductor integrated circuit according to claim 1, wherein said heat-sensitive element generates a lower potential difference as the temperature of said transistor increases.

3. The semiconductor integrated circuit according to claim 2, wherein said heat-sensitive element is a diode, or said heat-sensitive element is a bipolar transistor in which the base of its own is connected to the collector of its own.

4. The semiconductor integrated circuit according to claim 1, wherein said heat-sensitive element is located near said transistor.

5. A semiconductor integrated circuit comprising:
   a transistor which has a first electrode, a second electrode and a third electrode, said transistor conducting a current of a first power source from said second electrode to said third electrode by a power supplied to said first electrode;
   a driver configured to supply said first electrode with power for driving said transistor;
   a reference voltage circuit configured to generate a reference voltage which is variable in response to temperature of said transistor, said reference voltage being used as the reference for comparison;
   a comparative voltage circuit configured to generate a comparative voltage which is variable in response to a current flowing from said second electrode to said third electrode, said comparative voltage being compared with said reference voltage; and
   a controller which receives said reference voltage and said comparative voltage and which supplies a control signal to said driver, said control signal being based on a result of the comparison between the comparative voltage and the reference voltage to control the power supplied to said first electrode, said controller including a constant current circuit which flows a constant current to said reference voltage circuit and said comparative voltage circuit to generate said reference voltage and said comparative voltage, said constant current circuit outputting a power based on said comparative voltage, and a switching transistor which switches said drive signal in response to power output from said constant current circuit;
   wherein said reference voltage circuit includes a first load which is connected between said first power source and said constant current circuit, second and third loads each of which is connected between said constant current circuit and said second power source, and said heat-sensitive element intervening between said constant current circuit and said second power source and disposed on a common chip together with said transistor to generate a potential difference dependent upon temperature of said transistor, wherein said reference voltage is the voltage after passing at least said first load and is based on the potential difference across both ends of said heat-sensitive element.

6. The semiconductor integrated circuit according to claim 5, wherein said constant current circuit includes:

a first current mirror circuit which is connected to one end of said second load and one end of said third load to flow a reference constant current and a first comparative constant current in response to resistance values of said second and third loads; and a second current mirror circuit which is connected to said reference voltage circuit and said comparative voltage circuit to flow a second comparative constant current in response to said reference voltage and said comparative voltage, wherein said switching transistor switches said drive signal in response to a difference between said first comparative constant current and said second comparative constant current.

7. The semiconductor integrated circuit according to claim 5, wherein said heat-sensitive element generates a lower potential difference as the temperature of said transistor increases.

8. The semiconductor integrated circuit according to claim 7, wherein said heat-sensitive element is a diode, or said heat-sensitive element is a bipolar transistor in which the base of its own is connected to the collector of its own.

9. A semiconductor integrated circuit comprising:

a transistor which has a first electrode, a second electrode and a third electrode, said transistor conducting a current of a first power source from the second electrode to the third electrode by a power supplied to the first electrode;

a driver configured to supply said first electrode with power for driving said transistor;

a reference voltage circuit configured to generate a reference voltage which is used as the reference for comparison;

a comparative voltage circuit configured to generate a comparative voltage which is variable in response to both the temperature of said transistor and a value of the current flowing from said second electrode to said third electrode, said comparative voltage being compared with said reference voltage; and a controller which receives said reference voltage and said comparative voltage and which supplies a control signal to said driver, said control signal being based on a result of comparison between the comparative voltage and the reference voltage to control the power supplied to said first electrode;

wherein said reference voltage circuit includes a first load which is connected in series between said first power source and a constant current source connected to a second power source, wherein said reference voltage is a voltage based on the voltage after passing at least said first load from said first power source, wherein said comparative voltage circuit includes a heat-sensitive element which is located on a common chip together with said transistor to generate a potential difference depending upon the temperature of said transistor, and wherein said comparative voltage is a voltage based on a potential difference across both ends of said heat-sensitive element.

10. The semiconductor integrated circuit according to claim 9, wherein said comparative voltage circuit includes a second load which is operative as said heat-sensitive element and connected in series between said first power source and said second electrode, and third and fourth loads which are connected in series to each other and connected in parallel to said second load, and wherein said comparative voltage is a voltage at the node of said third and fourth loads.

11. The semiconductor integrated circuit according to claim 9, wherein said heat-sensitive element generates a higher potential difference as the temperature of said transistor increases.

12. The semiconductor integrated circuit according to claim 11, wherein said heat-sensitive element is a resistor.

13. The semiconductor integrated circuit according to claim 9, wherein said transistor is a bipolar transistor, said first electrode is the base thereof, said second electrode is the emitter thereof, and said third electrode is the collector thereof.

14. The semiconductor integrated circuit according to claim 9, wherein said transistor is a MOS transistor, said first electrode is the gate thereof, said second electrode is the drain thereof, and said third electrode is the source thereof.

15. The semiconductor integrated circuit according to claim 9, wherein said heat-sensitive element is located near said transistor.

16. The semiconductor integrated circuit according to claim 9, wherein said controller supplies a control signal to said driver to interrupt the power supply to the first electrode when said comparative voltage is approximately equal to said reference voltage.

* * * * *